United States Patent
Adachi

(10) Patent No.: US 10,916,457 B2
(45) Date of Patent: Feb. 9, 2021

(54) HEATING DEVICE AND SEMICONDUCTOR MANUFACTURING APPARATUS

(71) Applicant: NISSIN ION EQUIPMENT CO., LTD., Koka (JP)

(72) Inventor: Masakazu Adachi, Koka (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 317 days.

(21) Appl. No.: 15/678,296

(22) Filed: Aug. 16, 2017

(65) Prior Publication Data

US 2018/0122661 A1 May 3, 2018

(30) Foreign Application Priority Data

Oct. 31, 2016 (JP) ................................. 2016-212481
Mar. 24, 2017 (JP) ................................. 2017-060206

(51) Int. Cl.
| H05B 3/68 | (2006.01) |
| H01L 21/67 | (2006.01) |
| H01L 21/683 | (2006.01) |
| H01L 21/677 | (2006.01) |
| H01L 21/687 | (2006.01) |

(52) U.S. Cl.
CPC .. *H01L 21/67109* (2013.01); *H01L 21/67213* (2013.01); *H01L 21/67248* (2013.01); *H01L 21/67703* (2013.01); *H01L 21/683* (2013.01); *H01L 21/68707* (2013.01)

(58) Field of Classification Search
CPC ......... H01L 21/67103; H01L 21/67115; H01L 21/67109; H01L 21/67213; H01L 21/67248; H01L 21/677; H01L 21/67703–67736; H01L 21/683; H01L 21/68707
USPC .................. 219/443.1–468.2; 392/416, 418; 118/724–730
See application file for complete search history.

(56) References Cited

U.S. PATENT DOCUMENTS

| 6,021,152 A * | 2/2000 | Olsen ..................... C23C 14/12 372/99 |
| 6,620,251 B2 * | 9/2003 | Kitano .................. B08B 7/0057 118/50 |

(Continued)

FOREIGN PATENT DOCUMENTS

| JP | 6-204316 A | 7/1994 |
| JP | 10-284569 A | 10/1998 |

(Continued)

OTHER PUBLICATIONS

English Translation of JP2015-015330, Jan. 2015 (Year: 2015).*
Communication dated Oct. 18, 2017 from the Japanese Patent Office in counterpart application No. 2017-060206.

*Primary Examiner* — Sang Y Paik
(74) *Attorney, Agent, or Firm* — Sughrue Mion, PLLC

(57) ABSTRACT

A heating device is provided. The heating device includes a conveyance member that conveys a substrate between a heating position and a non-heating position, a support member that is provided on the conveyance member and that supports the substrate, a heater provided at the heating position and operable to heat a first surface of the substrate, and a heat reflecting plate attached to the conveyance member in facing relation to a second surface of the substrate opposite to the first surface.

17 Claims, 9 Drawing Sheets

(56) References Cited

U.S. PATENT DOCUMENTS

| | | | |
|---|---|---|---|
| 7,589,950 B2* | 9/2009 | Parkhe | H01L 21/6831 |
| | | | 279/128 |
| 2002/0086260 A1* | 7/2002 | Shang | H01L 21/67109 |
| | | | 432/247 |
| 2010/0059497 A1* | 3/2010 | Ranish | H01L 21/67115 |
| | | | 219/395 |
| 2012/0308215 A1* | 12/2012 | Li | F27B 17/0025 |
| | | | 392/416 |
| 2013/0118407 A1 | 5/2013 | Park et al. | |
| 2015/0227050 A1* | 8/2015 | Lin | H01L 21/67103 |
| | | | 438/5 |

FOREIGN PATENT DOCUMENTS

| | | |
|---|---|---|
| JP | 2013-535833 A | 9/2013 |
| JP | 2015-015330 A | 1/2015 |
| JP | 2015-154045 A | 8/2015 |
| JP | 2015-211201 A | 11/2015 |

\* cited by examiner

HEATING DEVICE AND SEMICONDUCTOR MANUFACTURING APPARATUS

CROSS-REFERENCE TO RELATED APPLICATIONS

This application claims priority from Japanese Patent Application No. 2017-060206, filed Mar. 24, 2017, and from Japanese Patent Application No. 2016-212481, filed Oct. 31, 2016 in the Japanese Patent Office, the entire contents of both of which are hereby incorporated by reference in their entirety.

BACKGROUND

1. Field

Apparatuses and devices consistent with the present disclosure relate to a heating device for raising a temperature of a substrate, and a semiconductor manufacturing apparatus equipped with the heating device.

2. Description of the Related Art

In semiconductor manufacturing, a substrate may be heated to a given temperature in order to perform a film forming treatment on the substrate, after which ion implantation is performed on the heated substrate.

SUMMARY

It is an aspect to provide a heating device capable of improving substrate heating efficiency to shorten a heating-up period, and of operating according to reduced input power so as to achieve lower power consumption, and to provide a semiconductor manufacturing apparatus equipped with the heating device.

According to an aspect of one or more exemplary embodiments, there is provided a heating device which comprises a conveyance member that conveys a substrate between a heating position and a non-heating position, a support member that is provided on the conveyance member and that supports the substrate, a heater provided at the heating position and operable to heat a first surface of the substrate, and a heat reflecting plate attached to the conveyance member in facing relation to a second surface of the substrate opposite to the first surface.

According to another aspect of one or more exemplary embodiments, there is provided a semiconductor manufacturing apparatus comprising a heating device, wherein the heating device comprises a conveyance member that conveys a substrate between a heating position and a non-heating position, a support member that is provided on the conveyance member and that supports the substrate, a heater provided at the heating position and operable to heat a first surface of the substrate, and a heat reflecting plate attached to the conveyance member in facing relation to a second surface of the substrate opposite to the first surface, wherein the semiconductor manufacturing apparatus is configured to transfer the substrate to the heater and immovably support the substrate on the heater to subject the substrate to a semiconductor manufacturing treatment.

According to another aspect of one or more exemplary embodiments, there is provided a heating device comprising an arm having a substrate support that supports a substrate attached thereto, a heater operable to heat a surface of the substrate; and a heat reflecting plate disposed between the arm and the substrate.

BRIEF DESCRIPTION OF THE DRAWINGS

FIGS. 5A and 5B are explanatory diagrams depicting a modification of a heat reflecting plate, wherein FIG. 5A is a top plan view along an X-Y plane, and FIG. 5B is a sectional view in the Z direction and taken along a line V-V in FIG. 5A;

FIGS. 9A and 9B are explanatory diagrams depicting another modification of a heat reflecting plate, wherein FIG. 9A is a top plan view along an X-Y plane, and FIG. 9B is a sectional view in the Z direction taken along the line V-V in FIG. 9A.

DESCRIPTION OF EXEMPLARY EMBODIMENTS

As a means to heat a substrate, there is a technique of supporting a substrate on one end of a conveyance arm, turning the conveyance arm so as to convey the substrate from a non-heating position to a heating position, and heating the substrate from a side of one surface of the substrate by a heater disposed at the heating position.

In this substrate heating technique, heat is liable to be dissipated from the other surface (non-heated surface) of the substrate on a side where the heater is not disposed, thereby causing poor substrate heating efficiency. This dissipation also leads to problems such as an increase in the time necessary for enabling the substrate to reach a given temperature, and an increase in power consumption of the heater.

Figure 1:
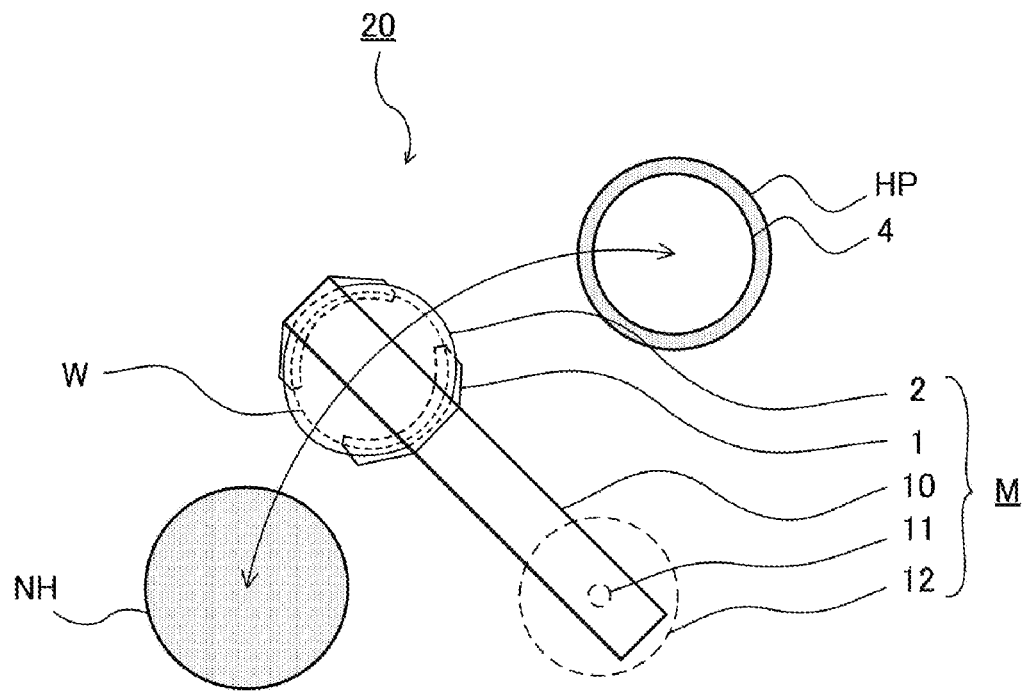
FIG. 1 is a schematic diagram depicting a configuration of a heating device according to an exemplary embodiment.
Figure 2:
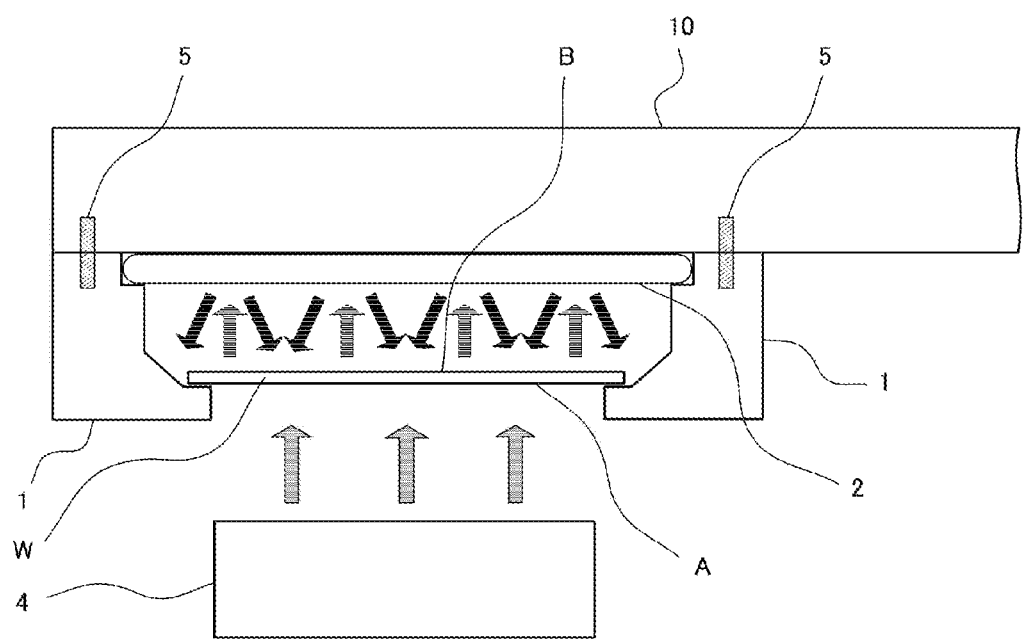
FIG. 2 is a schematic side view depicting the heating device in FIG. 1, in a state in which a substrate is conveyed to a heating position.

With reference to FIGS. 1 and 2, a configuration of a heating device according to an exemplary embodiment will now be described.

As depicted in FIG. 1, the heating device 20 according to the exemplary embodiment shown in FIGS. 1 and 2 comprises a conveyance mechanism M for conveying a substrate W (e.g., a semiconductor substrate such as a silicon substrate or a silicon carbide substrate, or a glass substrate such as an inorganic alkali glass substrate or a silica glass substrate) between a heating position HP and a non-heating position NH.

The depicted conveyance mechanism M is configured to convey the substrate W by means of moving the substrate in a swinging movement in a horizontal plane. The conveyance mechanism comprises a conveyance member 10, a support member 1, and a heat reflecting plate 2. The conveyance member 10 is, for example, a long plate-shaped arm, and is configured such that one end (e.g., a proximal end) thereof is rotated about a pivot shaft 11 by a drive source 12 such as an electric motor. The support member 1 is provided on the other end (e.g., a distal end) of the conveyance member 10 and supports at least a portion of the outer peripheral edge of the substrate W. The heat reflecting plate 2 is attached to the conveyance member 10 in facing relation to the substrate W, and the substrate W is supported by the support member 1, as shown in, for example, FIG. 2.

As shown in FIG. 2, the heat reflecting plate 2 is configured to cover a surface B of the substrate W. In other words, a facing area of the heat reflecting plate 2 to the surface B of the substrate W is equal to or greater than an area of the surface B, and, when viewing the substrate W across the heat reflecting plate 2, i.e. from top to bottom as shown by the arrow in FIG. 2, the substrate W is fully hidden behind the heat reflecting plate 2 so that the substrate cannot be visibly observed. That is, the heat reflecting plate 2 is configured to fully cover the surface B of the substrate W.

By using the heat reflecting plate 2 configured as above, heat dissipated from the surface B may be reflected back toward the surface B to obtain a heat reflecting effect over the entire surface B.

As a material for the heat reflecting plate 2, a metal having high heat reflection efficiency, such as aluminum or copper, may be used. On the other hand, additionally considering preventing such a metal material from mixing in the substrate, a non-metal material in combination with a metal material may be used, although in such a materials configuration, reflectance will be deteriorated to a certain degree.

As an example, a portion of the metal material that faces the substrate, the entire surface of the metal material that faces the substrate, or all surfaces of the metal material may be coated with a non-metal material, to prevent the metal material from mixing in the substrate. In this case, the non-metal material is composed of a heat permeable material, and the metal material is composed of a heat reflective material.

Further, with a view to improving reflection efficiency of the heat reflecting plate 2, a thickness, material and the like of the heat reflecting plate 2 may be appropriately selected so as to minimize a heat absorbing capacity thereof.

The heating device 20 comprises a heater 4 disposed at the heating position HP. The substrate W is conveyed to the heating position HP by the conveyance member 10, and heated at the heating position HP by the heater 4.

FIG. 2 depicts a state in which the substrate W is heated at the heating position HP. Arrowed lines marked between the heater 4 and the substrate W schematically denote a flow of heat from the heater 4 to a surface A of the substrate W. Similarly, arrowed lines marked between the substrate W and the heat reflecting plate 2 schematically denote a flow of heat between the surface B of the substrate W and the heat reflecting plate 2.

In the heating device 20 according to the exemplary embodiment shown in FIGS. 1 and 2, the heat reflecting plate 2 is provided in facing relation to the surface B of the substrate W, which is a back surface of the substrate W on a side opposite to a surface to be heated by the heater 4. As depicted in FIG. 2, the heat reflecting plate 2 is held between the support member 1 and the conveyance member 10.

By providing the heat reflecting plate 2, it becomes possible to reflect heat dissipated from the surface B of the substrate W that does not receive heat directly from the heater 4 back toward the substrate W. This configuration makes it possible to improve a substrate heating efficiency of heating the substrate W, and thus shorten a heating-up period, and reduce an input power to the heater 4 so as to achieve lower power consumption.

In the heating device 20 according to the exemplary embodiment shown in FIGS. 1 and 2, each of a plurality of the supporting members 1 is fixed to the conveyance member 10 by one or more bolts 5. In conjunction with the attachment of the support members 1 to the conveyance member 10, the heat reflecting plate 2 is attached to the conveyance member 10, so that it is possible to simplify a component assembling operation.

Further, by providing the support member 1, the heat reflecting plate 2 and the conveyance member 10 as separate components as in the heating device 20 according to the exemplary embodiment shown in FIGS. 1 and 2, a size, shape and the like of each of the support member 1 and the heat reflecting plate 2 can be appropriately changed to cope with changes in size of the substrate W to be treated or changes in a temperature distribution property of a surface of a substrate W to be treated. This configuration is superior in terms of versatility as compared to case where a plurality of components are formed as a single-piece integrated body.

Figure 3:
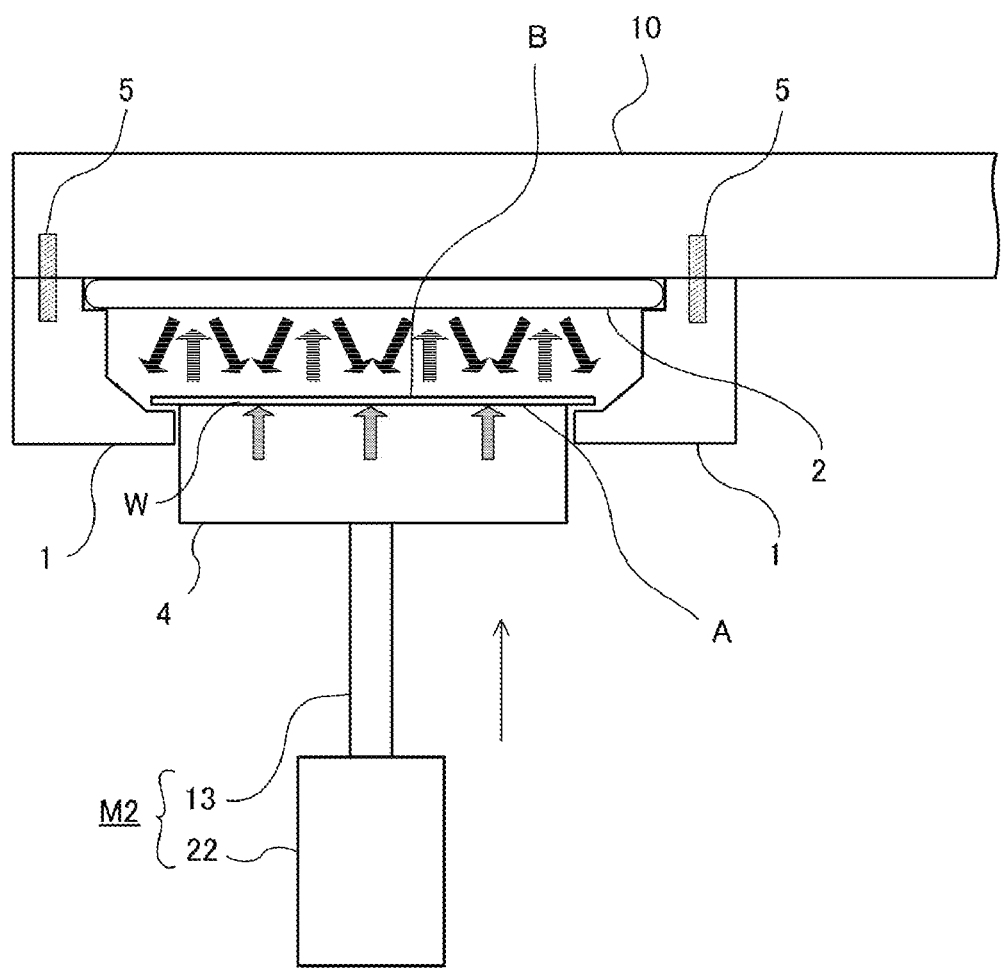
FIG. 3 is a schematic side view depicting a heating device comprising a second conveyance mechanism for conveying a heater, as a modification of the heating device in FIG. 1.

FIG. 3 depicts a heating device according to a modification of the heating device 20 shown in FIGS. 1 and 2. With a view to further improving the substrate heating efficiency, the heating device according to the modified exemplary embodiment shown in FIG. 3 further comprises a second conveyance mechanism M2 which includes a drive source 22, and a drive shaft 13 coupled to the heater 4. The second conveyance mechanism M2 is configured to move the heater 4 in a direction indicated by the arrow in FIG. 3. More specifically, the drive source 22 moves the heater 4 toward the substrate W.

When the heater 4 is moved in the direction of the arrow by the second conveyance mechanism M2, a surface of the heater 4 is brought into contact with the surface A of the substrate W. In a configuration in which the heater 4 is provided below the substrate W as shown in FIG. 3, when an upper surface of the heater 4 that is brought in contact with the substrate W is further moved toward the heat reflecting plate 2, the substrate W is transferred from the support member 1 to the heater 4.

After the substrate W is transferred to the heater 4, a distance between the heater 4 and the heat reflecting plate 2 is reduced as compared with the heating device 20 shown in FIGS. 1 and 2, thereby providing further improved substrate heating efficiency.

A timing of heating the substrate W by the heater 4 may be set just after transferring the substrate W to the heater 4. That is, the heater 4 may be set to start heating the substrate W after transferring the substrate W to the heater 4.

Alternatively, the heating of the substrate W may be started before transferring the substrate W to the heater 4. Specifically, when the heater 4 is spaced apart from the substrate W before transfer of the substrate W to the heater 4, the substrate W may be heated by the heater 4 once. Then, after a substrate temperature of the substrate W is raised to a given value, the substrate W may be transferred to the heater 4 to further heat the substrate W to a target temperature. That is, a two-stage heating method may be employed.

In the two-stage heating method, when the substrate W is supported by the support member 1, the supporting member 1 has a relatively small supporting area that supports the substrate W. Accordingly, heat stress in the substrate W caused by heat deformation of the substrate W may be released to a certain degree. By comparison, when the substrate W is transferred onto the upper surface of the heater 4, there is a relatively large supporting area that supports the substrate W (i.e., the upper surface of the heater 4 supports the substrate W), as compared to a case in which the support member 1 supports the substrate W. Thus, as compared to case where an entire heat stress is released on the heater 4 having a relatively large supporting area for the surface A of the substrate W, it becomes possible to reduce a risk of scratching of the surface A of the substrate W due to friction, or breaking of the substrate W.

The configuration of the second conveyance mechanism M2 is not limited to that depicted in FIG. 3. For example, instead of moving the heater 4, the conveyance member 10 may be moved. Alternatively, both of the heater 4 and the conveyance member 10 may be moved.

That is, in a generalized concept, the second transfer mechanism M2 may be configured to transfer, at the heating position HP, the substrate W from the support member 1 to the heater 4, and further convey the substrate W to a position closer to the heat reflecting plate 2 than a position where the substrate W is supported by the support member 1.

The configuration of the heat reflecting plate 2 may be variously modified. For example, the heat reflecting plate 2 may be configured as depicted in FIGS. 4A and 4B, and/or FIGS. 5A and 5B, according to various exemplary embodiments.

Figure 4A:
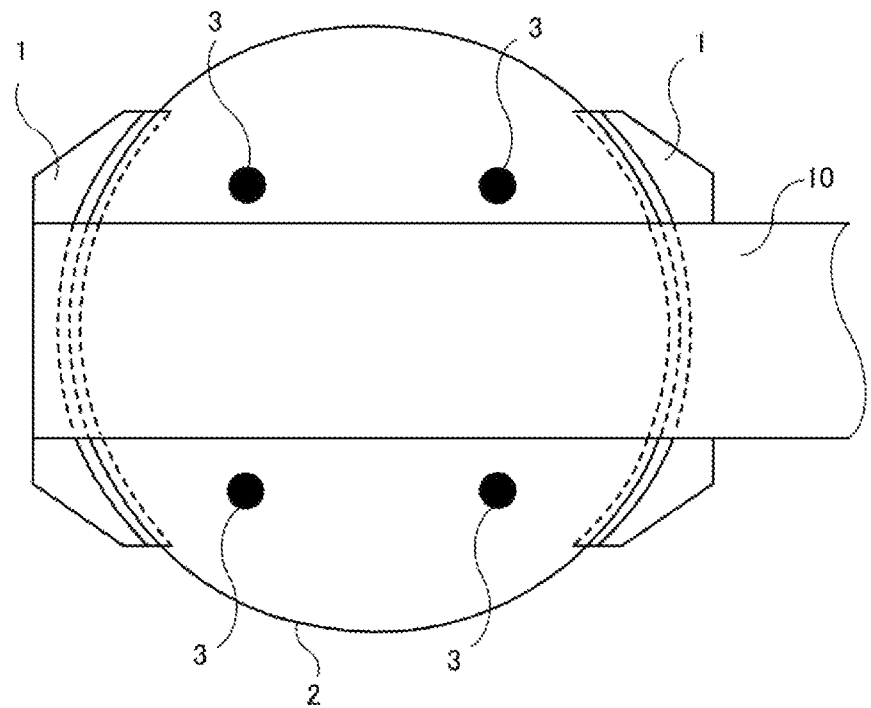
FIGS. 4A and 4B are schematic top plan views depicting modifications of a heat reflecting plate, according to an exemplary embodiment.

A heat reflecting plate 2 depicted in FIG. 4A is partially formed with at least one opening 3. In the configuration shown in FIG. 4A, four openings 3 are formed in the heat reflecting plate 2a. However, this is only an example, and a number of the openings 3 may be one, or may be two or more. Further, a shape of the opening 3 may be a circular shape as shown in the example of FIG. 4A, or may be any of various other shapes such as a rectangular shape or a triangular shape, and a position of the opening 3 is not limited to the depicted positions in FIG. 4A.

For example, the openings 3 formed as above make it possible to measure the temperature of the substrate W from above the substrate W through the openings 3 by using a radiation thermometer. Further, by appropriately setting a size, shape, position and the like of the openings 3, it becomes possible to adjust a temperature distribution of the surface B of the substrate W on the side of the heat reflecting plate 2.

Figure 4B:
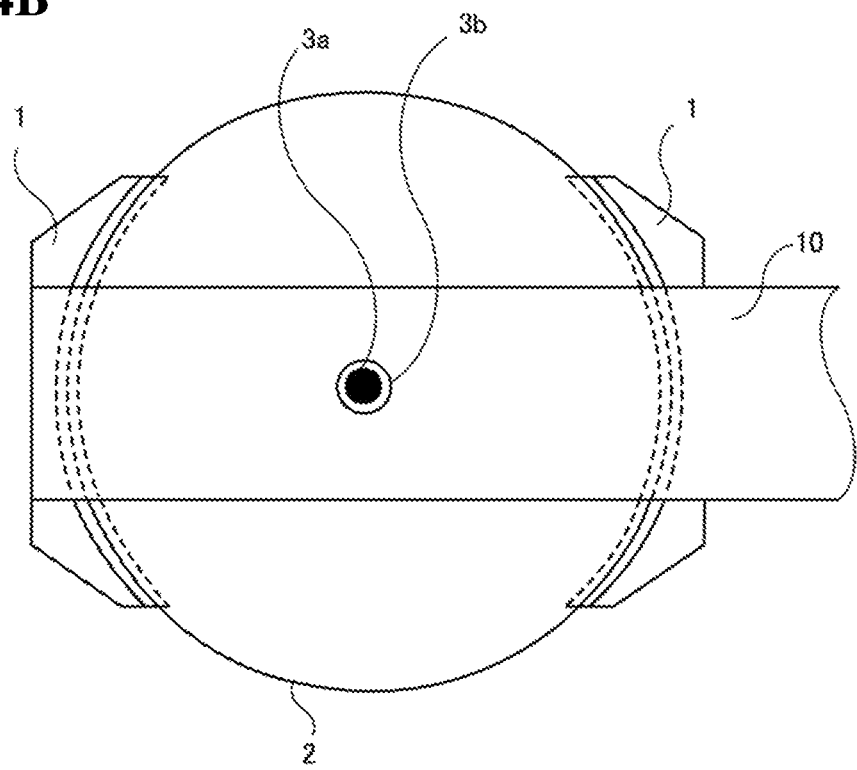

In a modification shown in FIG. 4B (top plan view), in a case in which a temperature of a central region of the substrate W that overlaps the conveyance member 10 is to be measured from above the substrate W by a radiation thermometer, an opening 3a may be formed in the heat reflecting plate 2 and a corresponding opening 3b may be formed in the conveyance member 10 to expose the central region of the substrate W to be measured. It should be understood that the temperature of the substrate W may be measured using a thermocouple, instead of the radiation thermometer. Further, as a measurement method for the substrate temperature, any of various heretofore-known methods may be employed.

Figure 5A:
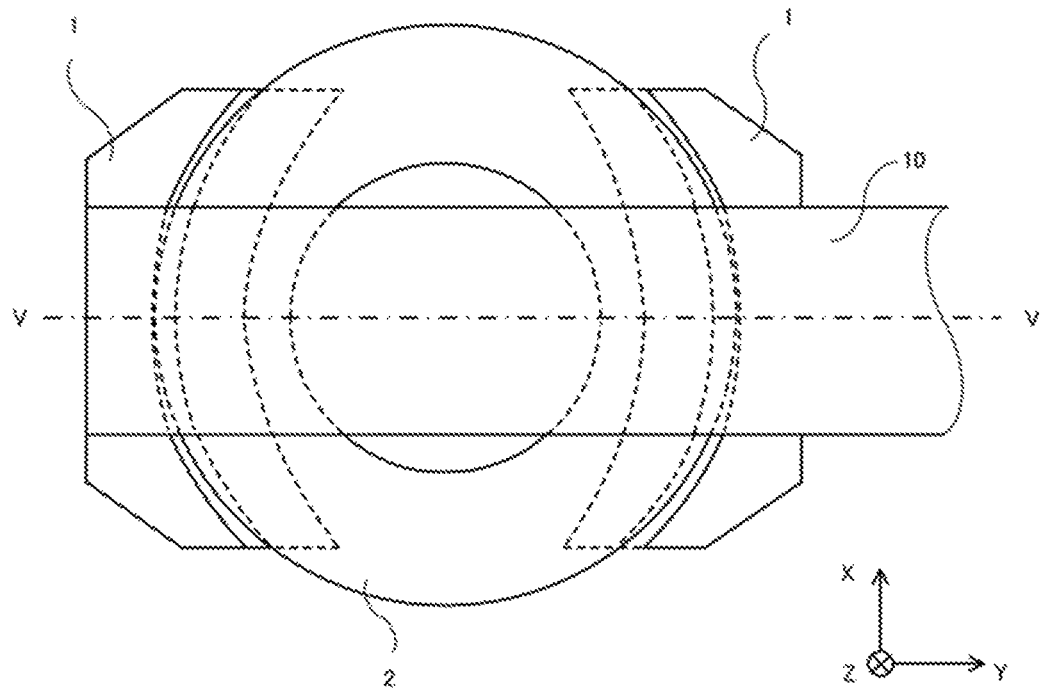
Figure 5B:
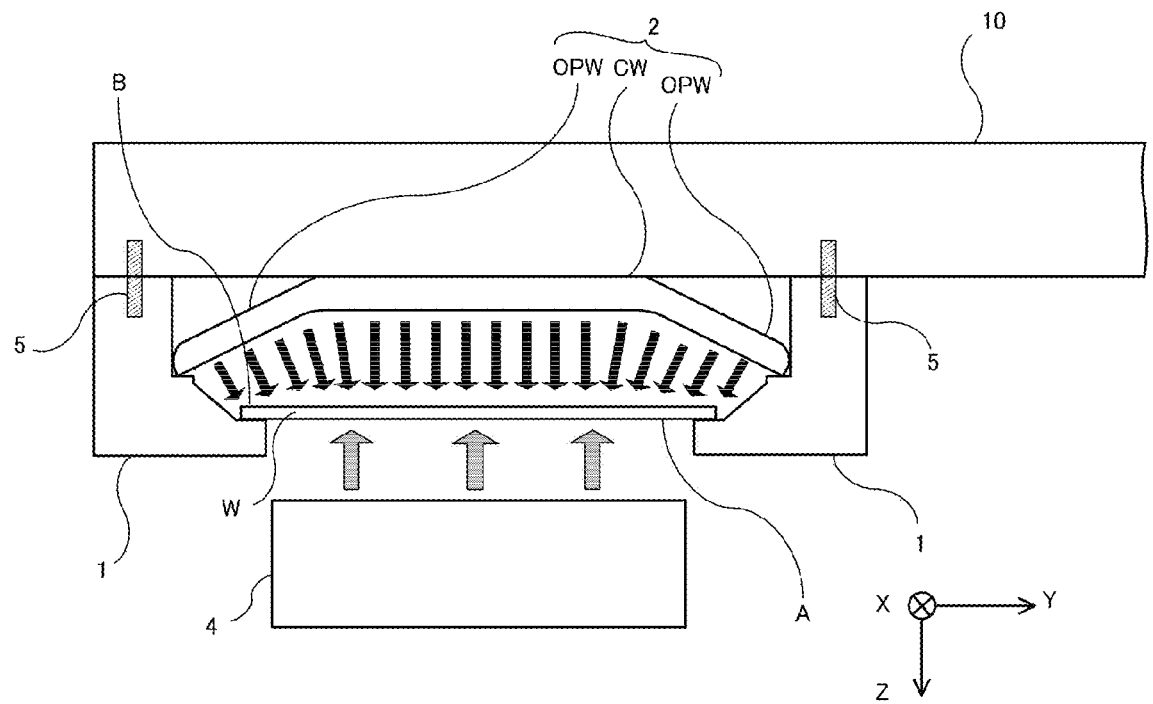

A heat reflecting plate 2 depicted in FIGS. 5A and 5B is formed in a concave shape concaved with respect to the substrate W, instead of a flat plate shape.

FIG. 5A is a top plan view in which the conveyance member 10 located at the heating position HP is viewed from above. FIG. 5B is a sectional view taken in a Z direction along the one-dot chain line V-V in FIG. 5A.

The heat reflecting plate 2 is a member having a flat central wall portion CW along the conveyance member 10, and outer peripheral wall portions OPW that extend from the flat central wall portion CW and gradually incline away from the conveyance member 10 toward the substrate W. In other words, an acute angle is formed between the conveyance member 10 and the outer peripheral wall portions OPW.

By using the heat reflecting plate 2 configured as above, it becomes possible to effectively reflect heat dissipated from the surface B of the substrate W back toward the substrate W as indicated by the arrowed lines in FIG. 5B.

It should be understood that the concave shape is not limited to the above shape. For example, the outer peripheral wall portion may be gradually expanded in a non-linear manner.

Figure 6:
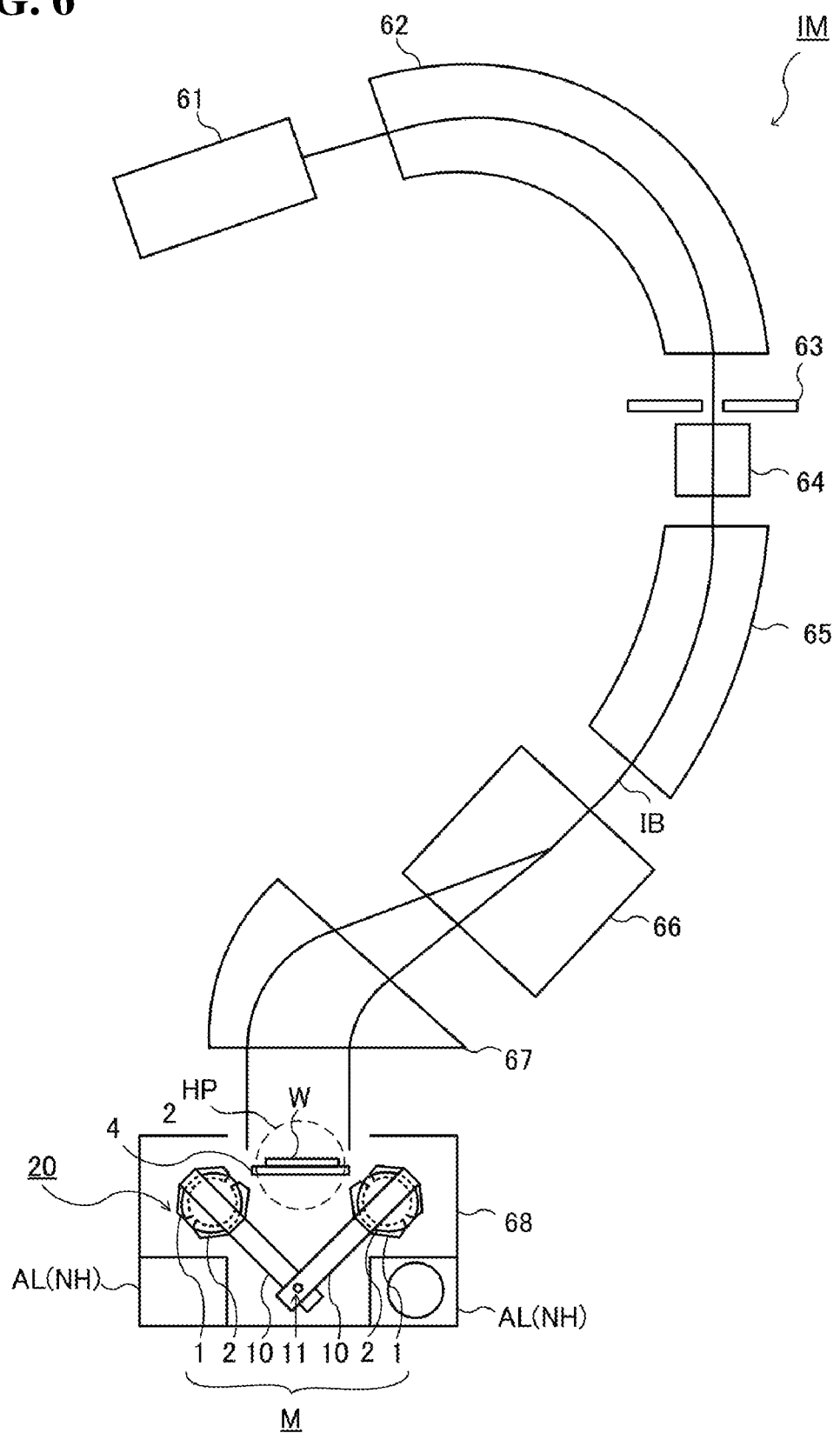
FIG. 6 is a schematic diagram depicting an example of a semiconductor manufacturing apparatus equipped with the heating device, according to an exemplary embodiment.
Figure 7:
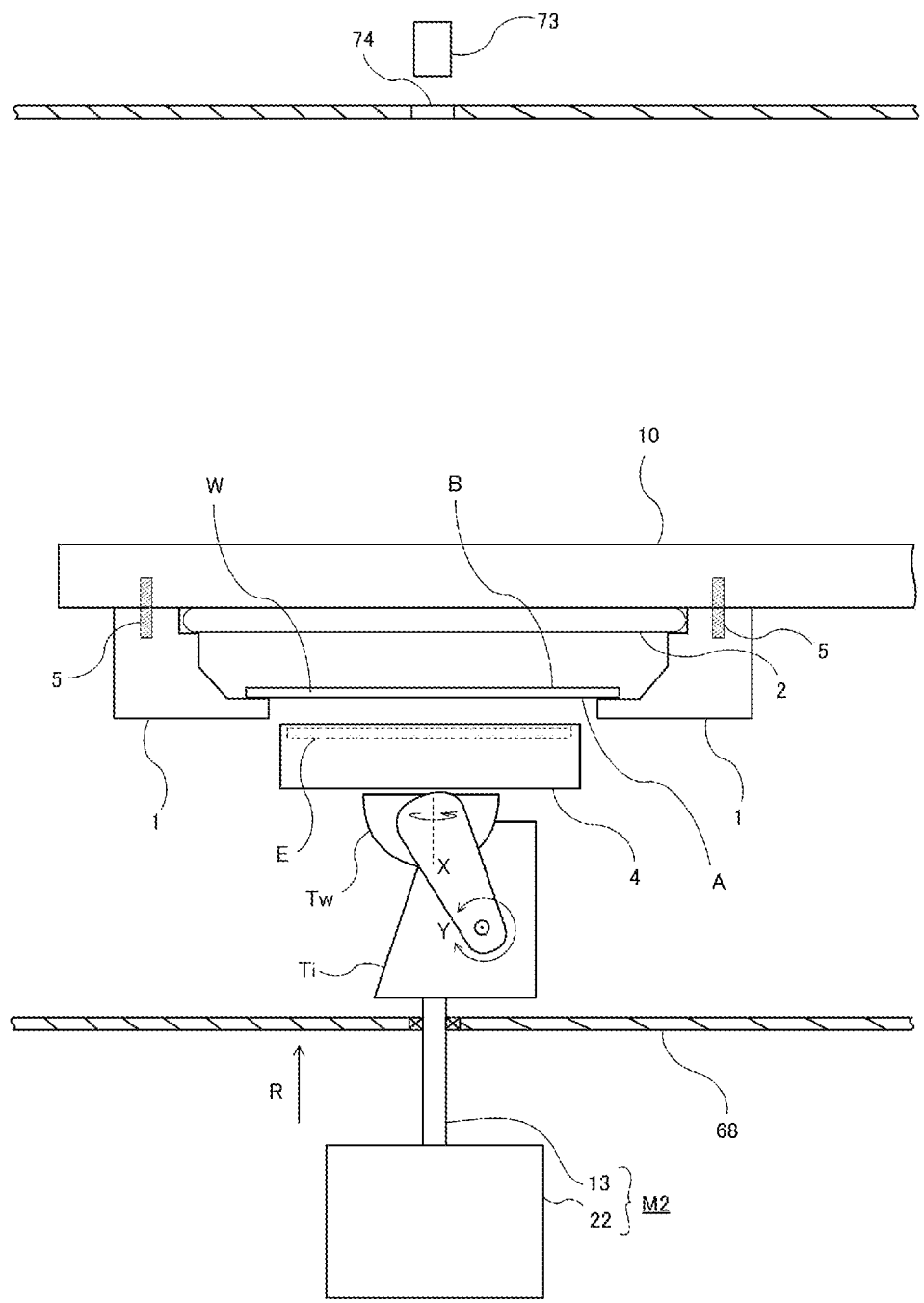
FIG. 7 is a schematic side view depicting a heating device of the semiconductor manufacturing apparatus of FIG. 6, in a state in which a substrate is conveyed to a heating position.

FIGS. 6 and 7 depict an example of a semiconductor manufacturing apparatus equipped with a heating device 20, according to an exemplary embodiment. The semiconductor manufacturing apparatus depicted in FIGS. 6 and 7 may be an ion implantation apparatus IM.

An ion source 61 is operable to emit an ion beam IB. The ion beam IB may be approximately spot-shaped. Then, a mass analyzing electromagnet 62 and an analysis slit 63 are operable to mass analyze the ion beam IB emitted from the ion source 61, and an accelerator/decelerator 64 is operable to accelerate or decelerate the ion beam IB. Subsequently, an energy separator 65 is operable to enable a component of the ion bean IB including a desire energy to pass therethrough to a downstream side, and a scanner 66 is operable to scan the ion beam IB along one direction. The scanned ion beams IB pass through a beam parallelizer 67, so that they are deflected to form ion beams IB parallel to each other in terms of a beam traveling direction, and the parallel ion beams IB enter a treatment chamber 68.

A heating device 20 according to the exemplary embodiment shown in FIGS. 6 and 7 is provided in the treatment chamber 68. As with the exemplary embodiment shown in FIGS. 1 and 2, the heating device 20 shown in FIGS. 6 and 7 may comprise a conveyance mechanism M which comprises two conveyance members 10 each independently turnable about a pivot shaft 11 according to a non-depicted drive source, and a heat reflecting plate 2 attached to a distal end of each of the conveyance members 10. The conveyance mechanism M is configured to convey a substrate W between a vacuum auxiliary chamber AL which is an example of a non-heating position NH, and an implantation position which is an example of a heating position HP, while supporting the substrate W on a support member 1 thereof.

The heating device 20 shown in FIGS. 6 and 7 may comprise the second conveyance mechanism M2 described with reference to the exemplary embodiment shown in FIG. 3. As depicted in FIG. 7, the heating device 20 may further comprise a twist mechanism Tw for rotating a heater 4 provided with an electrostatic chuck E, about an X axis by an angle, and a tilt mechanism Ti for rotating the heater 4 and the twist mechanism Tw, about a Y axis by an angle. Further, the heating device 20 may be configured to enable a temperature of the substrate W to be measured from above a ceiling of the treatment chamber 68 through a view port 74 formed in the ceiling, by using a radiation thermometer 73.

As shown in FIGS. 6 and 7, in a state in which the substrate W is supported by the support member 1, the substrate W is heated by the heater 4 located below the substrate W until the temperature of the substrate W is raised to a first temperature. Then, after transferring the substrate W onto the heater 4 by the second conveyance mechanism M2, the substrate W is heated while being immovably supported on the heater 4 by the electrostatic chuck E, until the temperature of the substrate W is raised to a second temperature (e.g., an eventual target temperature).

After transferring the substrate W to the heater 4, the conveyance member 10 (without the substrate W) is turned toward the non-heating position NH, i.e., moved away from the position just above the heater 4. Subsequently, the substrate W which is now on the heater 4 and free of the conveyance member 10 is rotated about the Y-axis by the tilt mechanism Ti so as to enable the substrate W to be irradiated with the ion beams IB at an angle. The posture of the heater 4 depicted in FIG. 6 is a state after being rotated 90 degrees from the position in FIG. 7 by the tilt mechanism Ti. In this state, the heater 4 is reciprocatingly conveyed along a direction of the arrow R described in FIG. 7 by the second conveyance mechanism M2 to thereby perform ion beam irradiation.

Figure 8:
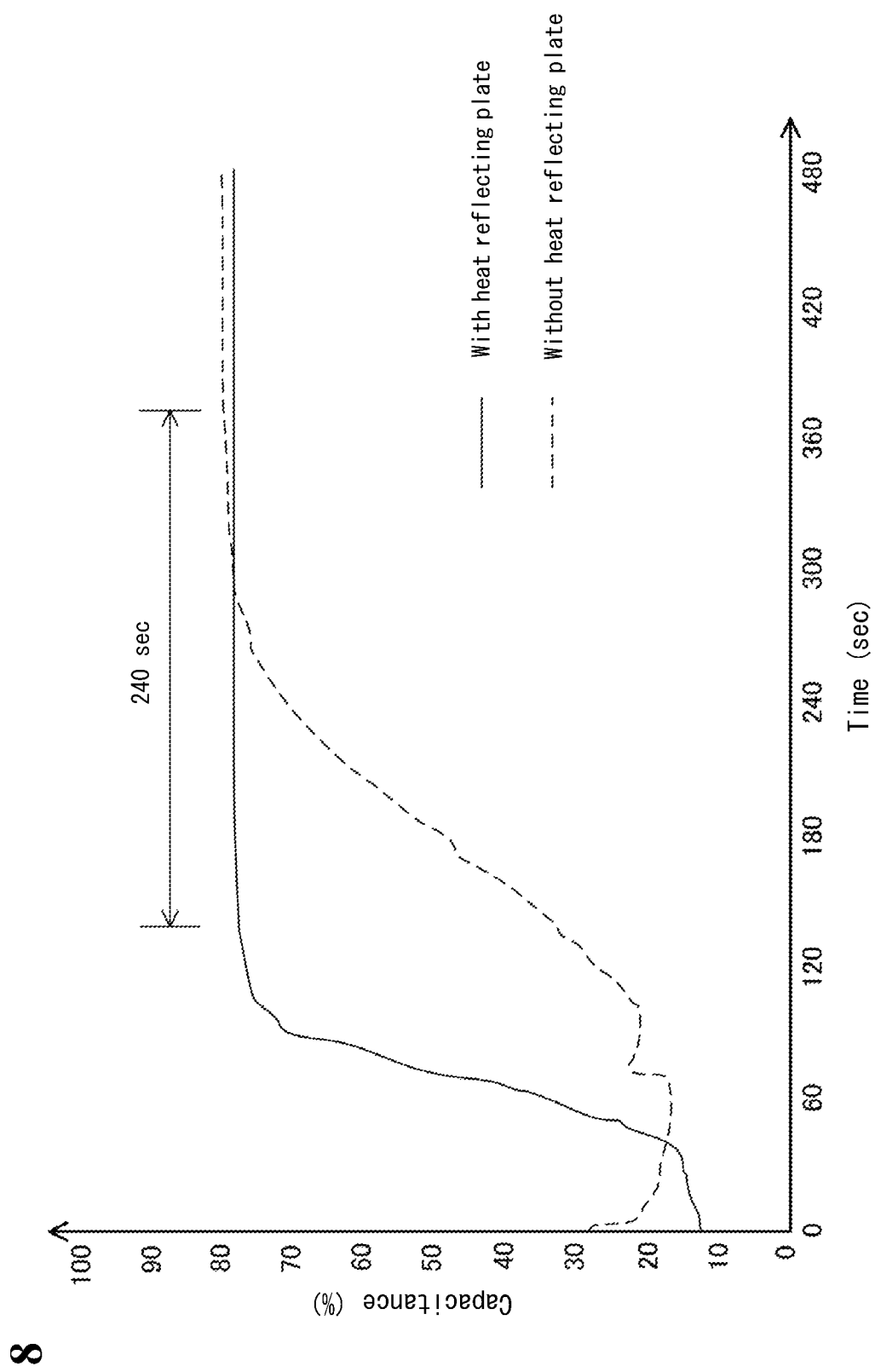
FIG. 8 is a graph depicting experimental results representing a temporal change in capacitance between a substrate and an electrostatic chuck.

FIG. 8 is an experimental result obtained in the ion implantation apparatus IM in FIGS. 6 and 7. This experimental result shows a difference in time for reaching a state in which the substrate W can be immovably supported using the electrostatic chuck E in a strong and stable manner, depending on the presence or absence of the heat reflecting plate 2. Except for the presence or absence of the heat reflecting plate 2, the experimental result in FIG. 8 was obtained under the same conditions in terms of the configuration of the ion implantation apparatus IM.

The capacitance on the vertical axis in the graph of FIG. 8 is a capacitance between the substrate W and the electrostatic chuck E. The capacitance is measured using a heretofore-known capacitance meter.

A value of capacitance between the substrate W and the electrostatic chuck E as measured when a substrate W free of heat strain during a non-heating state in which the substrate W is not heated by the heater 4 and in a normal-temperature state is chucked onto the heater 4 by the electrostatic chuck E at a chucking voltage of 700 V corresponds to a capacitance of 80% in FIG. 8. When the capacitance is close to 80%, it is determined that heat strain of the substrate W is sufficiently relaxed to establish a state in which the substrate W may be immovably supported on the heater 4 in a strong and stable manner, and it is allowed to advance to the next step (of immovably supporting the substrate W by the electrostatic chuck).

Time 0 (sec) on the horizontal axis in the graph of FIG. 8 denotes a time after the substrate W supported on the support member 1 has been heated for 30 sec by the heater 4 and then transferred onto the heater 4 by the second conveyance mechanism M2.

In FIG. 8, comparing the heating device with the heat reflecting plate 2, according to the above exemplary embodiments, to a heating device without the heat reflecting plate 2, it is shown that, in the heating device according to the above exemplary embodiments, the capacitance reaches 80% at an earlier timing by about 240 sec. This shows that the heating device with the heat reflecting plate 2, according to the above exemplary embodiments, makes it possible to significantly shorten a time for fulfilling a condition for immovable support of the substrate W in a strong and stable manner.

In the heating device according to the above exemplary embodiments, the conveyance member 10 is configured to be turned so as to convey the substrate W. Alternatively, the conveyance member 10 may be configured to be moved linearly so as to convey the substrate W. For example, a conveyance member 10 may be configured such that a central portion thereof is provided with a support member 1 for supporting the substrate W, and opposite ends thereof are slidably moved by a linearly moving mechanism.

A usage environment of the heating device 20 according to the above exemplary embodiments may be a vacuum environment or may be an atmospheric environment.

The heating device 20 according to the above exemplary embodiments may be used in any of various semiconductor manufacturing apparatuses other than the ion implantation apparatus depicted in FIGS. 6 and 7, such as a film forming apparatus, requiring preliminary heating of a substrate. The heating device 20 according to the above exemplary embodiments may be used in any semiconductor manufacturing apparatus which preforms heating of a substrate.

Although the above exemplary embodiments have been described based on an example where the electrostatic chuck E is employed as a mechanism for immovably supporting the substrate W on the heater 4, it is possible to use any heretofore-known mechanical-type or vacuum suction-type immovably supporting mechanism, instead of the electrostatic chuck. The immovably supporting mechanism may be composed of a combination of mechanical-type and either vacuum suction-type or electrostatic-type immovable support mechanisms.

Although the above exemplary embodiments have been described based on an example where the conveyance member 10 has a long plate shape, the shape of the conveyance member 10 is not limited thereto, but may be any of various shapes, such as a circular shape and a triangular shape.

Although the above exemplary embodiments have been described based on an example where the heat reflecting plate is configured to fully cover the non-heated surface of the substrate W, the size of the heat reflecting plate is not limited thereto.

Figure 9A:
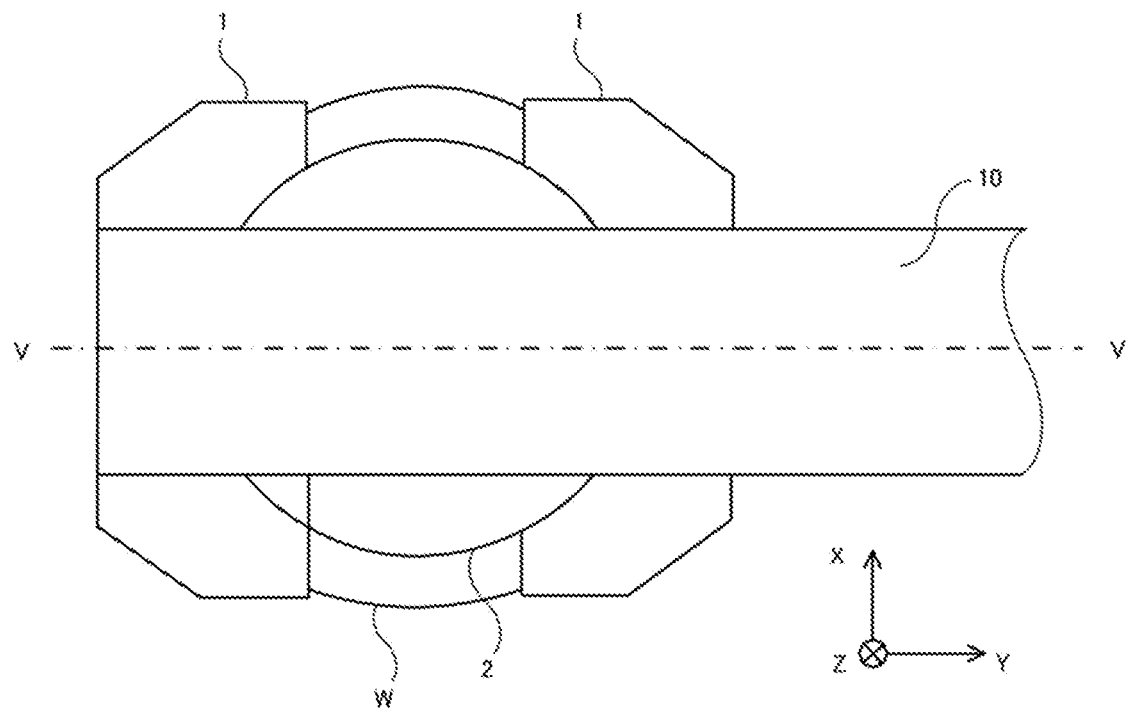
Figure 9B:
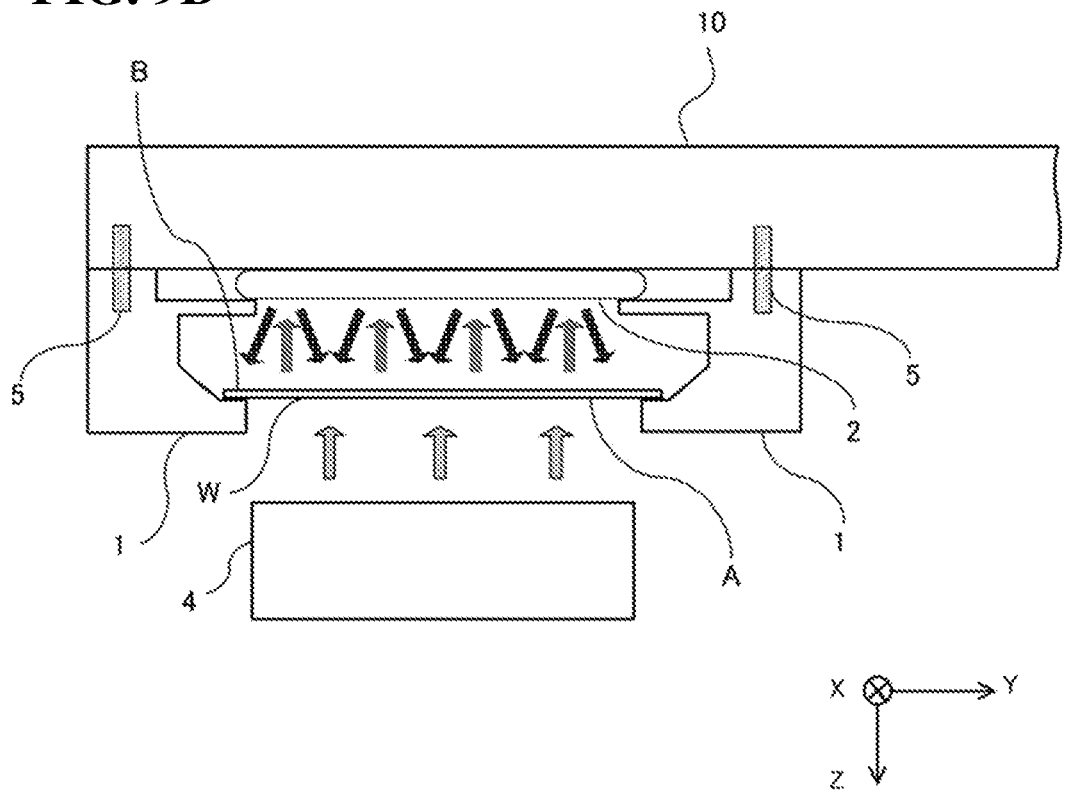

For example, as depicted on FIGS. 9A and 9B, a heat reflecting plate having a size less than a size of the substrate W may be provided on the side of the surface B of the substrate W from which heat is dissipated. In this case, it is also possible to reflect heat dissipated from the surface B of the substrate W back toward the substrate W.

Although the above exemplary embodiments have been described based on an example where the heater 4 is disposed on the side of one surface of the substrate W so as to heat the substrate W, an additional heater may be disposed between the heat reflecting plate 2 and the substrate W.

Figure 10:
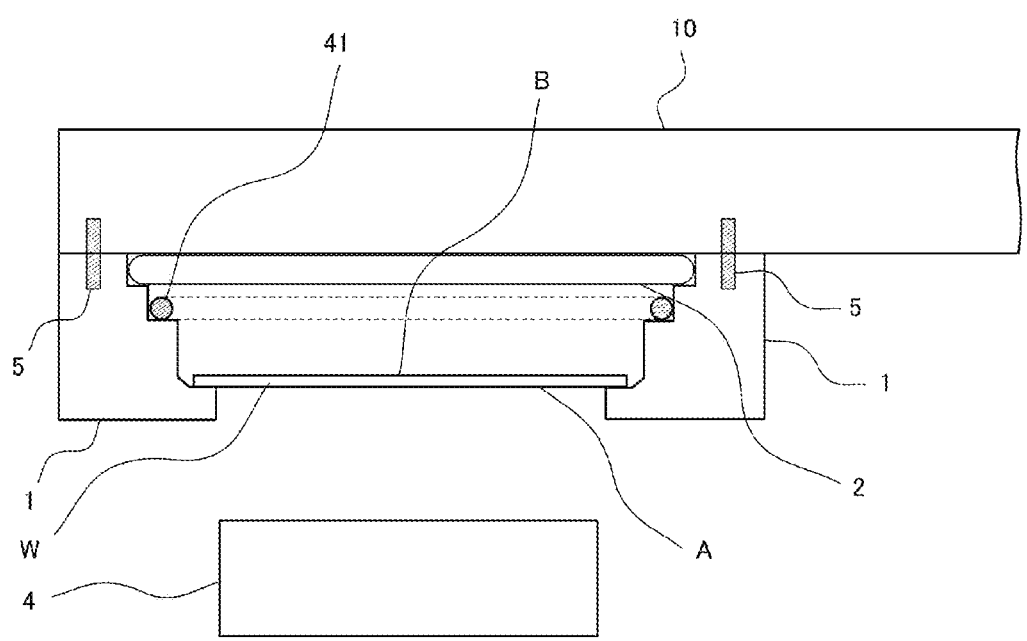
FIG. 10 is an explanatory diagram depicting an additional heater, according to an exemplary embodiment.

For example, an additional heater 41 may be an annular-shaped carbon infrared heater having an open space in a central region thereof so as to enable the heat reflecting plate 2 to be seen therethrough from the side of the substrate W, and supported on the support member 1 as depicted in FIG. 10. During a period in which the substrate W is conveyed from the non-heating position NH to the heating position HP by the conveyance member 10, the substrate W may be heated by the additional heater 41 beforehand. This makes it possible to complete the substrate heating in a shorter period of time.

It is understood that the present inventive concept is not limited to the above exemplary embodiments, but various other changes and modifications may be made therein without departing from the spirit and scope thereof as set forth in appended claims.

What is claimed is:
1. A heating device comprising:
   a conveyance member that conveys a substrate between a heating position and a non-heating position;

a support member that is provided on the conveyance member and that supports the substrate;

a heater provided at the heating position and operable to heat a first surface of the substrate; and a heat reflecting plate attached to the conveyance member in facing relation to a second surface of the substrate opposite to the first surface, wherein a size of the heat reflecting plate is equal to or greater than a size of the second surface of the substrate.

2. The heating device as recited in claim 1, wherein the heat reflecting plate is configured to cover the second surface of the substrate.

3. The heating device as recited in claim 1, which comprises a conveyance mechanism configured to transfer, at the heating position, the substrate from the support member to the heater, and convey the transferred substrate to a position closer to the heat reflecting plate than a position at which the support member supports the substrate.

4. The heating device as recited in claim 1, wherein the heat reflecting plate has a concave shape.

5. The heating device as recited in claim 1, wherein the heat reflecting plate is formed with an opening.

6. The heating device as recited in claim 3, wherein the heater immovably supports the substrate after transfer by one or more of a mechanical manner, an electrostatic manner or a vacuum suction manner.

7. A semiconductor manufacturing apparatus comprising a heating device, wherein the heating device comprises:

a conveyance member that conveys a substrate between a heating position and a non-heating position;

a support member that is provided on the conveyance member and that supports the substrate;

a heater provided at the heating position and operable to heat a first surface of the substrate; and a heat reflecting plate attached to the conveyance member in facing relation to a second surface of the substrate opposite to the first surface, a size of the heat reflecting plate being equal to or greater than a size of the second surface of the substrate, wherein the semiconductor manufacturing apparatus is configured to transfer the substrate to the heater and immovably support the substrate on the heater to subject the substrate to a semiconductor manufacturing treatment.

8. A heating device comprising:

an arm having a substrate support that supports a substrate attached thereto;

a heater operable to heat a surface of the substrate;

a heat reflecting plate disposed between the arm and the substrate, a size of the heat reflecting plate being equal to or greater than a size of the substrate; and a conveyance mechanism that is operable to move the heater towards the surface of the substrate, wherein the conveyance mechanism is operable to move the heater to transfer the substrate from being supported by the substrate support to being supported by the heater.

9. The heating device as recited in claim 8, wherein the heater heats a first surface of the substrate, and the heat reflecting plate reflects heat toward a second surface of the substrate that is opposite to the first surface.

10. The heating device as recited in claim 8, wherein the heat reflecting plate is attached to the arm by the substrate support.

11. The heating device as recited in claim 10, wherein the substrate support is attached to the arm by one or more bolts.

12. The heating device as recited in claim 8, wherein the conveyance mechanism moves the transferred substrate closer to the heat reflecting plate than a position at which the substrate is supported by the substrate support.

13. The heating device as recited in claim 8, wherein the heat reflecting plate is made of a metal having a high heat reflection efficiency.

14. The heating device as recited in claim 13, wherein the heat reflecting plate is at least partially coated with a non-metal material.

15. The heating device as recited in claim 8, wherein the heat reflecting plate is made of a metal material in combination with a non-metal material.

16. The heating device as recited in claim 8, wherein the heat reflecting plate comprises at least one opening.

17. The heating device as recited in claim 8, wherein the heat reflecting plate is a concave plate.

* * * * *